(12) United States Patent
Wu et al.

(10) Patent No.: US 7,000,177 B1
(45) Date of Patent: Feb. 14, 2006

(54) PARITY CHECK MATRIX AND METHOD OF FORMING THEREOF

(75) Inventors: Zining Wu, Los Altos, CA (US); Gregory Burd, San Jose, CA (US)

(73) Assignee: Marvell International Ltd., Hamilton (BM)

(*) Notice: Subject to any disclaimer, the term of this patent is extended or adjusted under 35 U.S.C. 154(b) by 884 days.

(21) Appl. No.: 09/730,598

(22) Filed: Dec. 7, 2000

Related U.S. Application Data

(60) Provisional application No. 60/214,781, filed on Jun. 28, 2000.

(51) Int. Cl.
G06F 11/00 (2006.01)
H03M 13/00 (2006.01)

(52) U.S. Cl. ............. 714/801; 714/752; 714/762; 714/788; 714/794; 714/795; 375/262; 375/341

(58) Field of Classification Search ........ 714/800–801, 714/762, 788, 752, 794–795; 375/341, 262
See application file for complete search history.

(56) References Cited

U.S. PATENT DOCUMENTS

| | | | |
|---|---|---|---|
| 4,295,218 A * | 10/1981 | Tanner .................. 714/762 |
| 4,601,044 A | 7/1986 | Kvomer, III et al. |
| 5,537,444 A | 7/1996 | Nill et al. .................. 375/341 |
| 5,757,821 A | 5/1998 | Jamal et al. |
| 5,926,232 A | 7/1999 | Mangold et al. ......... 348/845.1 |
| 5,930,272 A | 7/1999 | Thesling |
| 5,933,462 A | 8/1999 | Viterbi et al. ............... 375/341 |
| 5,949,831 A | 9/1999 | Coker et al. |
| 5,974,540 A | 10/1999 | Morikawa et al. |
| 5,983,385 A | 11/1999 | Khayrallah et al. |
| 6,002,716 A | 12/1999 | Meyer et al. ............... 375/231 |
| 6,009,549 A | 12/1999 | Bliss et al. .................. 714/769 |
| 6,021,518 A | 2/2000 | Pelz .......................... 714/799 |
| 6,023,783 A * | 2/2000 | Divsalar et al. ............. 714/792 |
| 6,028,728 A | 2/2000 | Reed ........................... 360/51 |
| 6,081,918 A | 6/2000 | Spielman .................... 714/746 |
| 6,145,144 A | 11/2000 | Poehlman et al. |
| 6,161,209 A | 12/2000 | Moher |
| 6,182,261 B1 | 1/2001 | Haller et al. |
| 6,219,817 B1 | 4/2001 | Holman |
| 6,427,220 B1 | 7/2002 | Vityaev |
| 6,438,180 B1 * | 8/2002 | Kavcic et al. ............... 375/341 |
| 6,539,367 B1 | 3/2003 | Blanksby et al. |
| 6,581,181 B1 | 6/2003 | Sonu |

(Continued)

FOREIGN PATENT DOCUMENTS

JP 2004164767 6/2004

(Continued)

OTHER PUBLICATIONS

U.S. Appl. No. 09/559,186, filed Apr. 27, 2000, Nazari et al.

(Continued)

*Primary Examiner*—Guy J. Lamarre

(57) ABSTRACT

A data transmission system is provided for transmitting user data to and receiving data from a communication channel, including a parity check matrix having M tiers, wherein $M \leq 2$, Dmin=2*M for M=1 . . . 3 or $2*M \leq Dmin \leq 6$ for M>3, wherein Dmin is the minimum Hamming distance, tc=M, wherein tc is the column weight, and cycle-4=0. A linear block encoder encodes the user data in response to the parity check matrix, and a transmitter transmits an output of the linear block encoder to the communication channel. A soft channel decoder decodes data, and a soft linear block code decoder to decode data decoded by the soft channel decoder in response to the parity check matrix.

192 Claims, 6 Drawing Sheets

U.S. PATENT DOCUMENTS

| | | |
|---|---|---|
| 6,634,007 B1 | 10/2003 | Koetter et al. |
| 6,691,263 B1 | 2/2004 | Vasic et al. |
| 6,708,308 B1 | 3/2004 | De Souza et al. |
| 6,715,121 B1 | 3/2004 | Laurent |

FOREIGN PATENT DOCUMENTS

| | | |
|---|---|---|
| WO | WO 96/37050 | 11/1996 |
| WO | WO 00/19616 A2 | 4/2000 |

OTHER PUBLICATIONS

U.S. Appl. No. 09/730,597, filed Dec. 7, 2000, Burd et al.

U.S. Appl. No. 09/730,752, filed Dec. 7, 2000, Burd et al.

U.S. Appl. No. 09/730,603, filed Dec. 7, 2000, Wu et al.

U.S. Appl. No. 09/901,507, filed Jul. 9, 2001, Wu et al.

Shoemake and Heegard, "Computationally Efficient Turbo Decoding with Bi-Directional Viterbi Algorithm (BIVA)", IEEE, ISIT 1997.

L.H.C. Lee, Computation of the Right-Inverse of G(D) and the Left-Inverse of H'(D), Jun. 21, 1990, I.E.E.E. vol. 26, No. 13, pp. 904-906.

Oberg, Mats, et al., "Parity Check Codes for Partial Response Channel," IEEE Global Telecommunications Conference—GLOBECOM '99, pp. 717-722, 1999.

Hagenauer, Joachim, et al. "A Viterbi Algorithm with Soft-Decision Outputs and Its Application," IEEE GLOBECOM '90, pp. 1680-1686 (47.1.1-47.1.7), Nov. 1989.

"An Intuitive Justification and a Simplified Implementation of the MAP Decoder for Convolutional Codes", IEEE Journal On Selected Areas In Communications, vol. 16, No. 2, Feb. 1995, Andrew J. Viterbi.

"Good Error-Correcting Codes Based On Very Sparse Matrices", IEEE Transactions On Information Theory, vol. 45, No. 2, Mar. 1999, David J.C. MacKay.

"Low-Density Parity-Check Codes", Robert G. Gallager 1963.

"Coding And Iterative Detection For Magnetic Recording Channels", The Kluwer International Series In Engineering And Computer Science, Zining Wu.

Coding, Iterative Detection And Timing Recovery For Magnetic Recording Channels, A Dissertation, Zining Wu.

\* cited by examiner

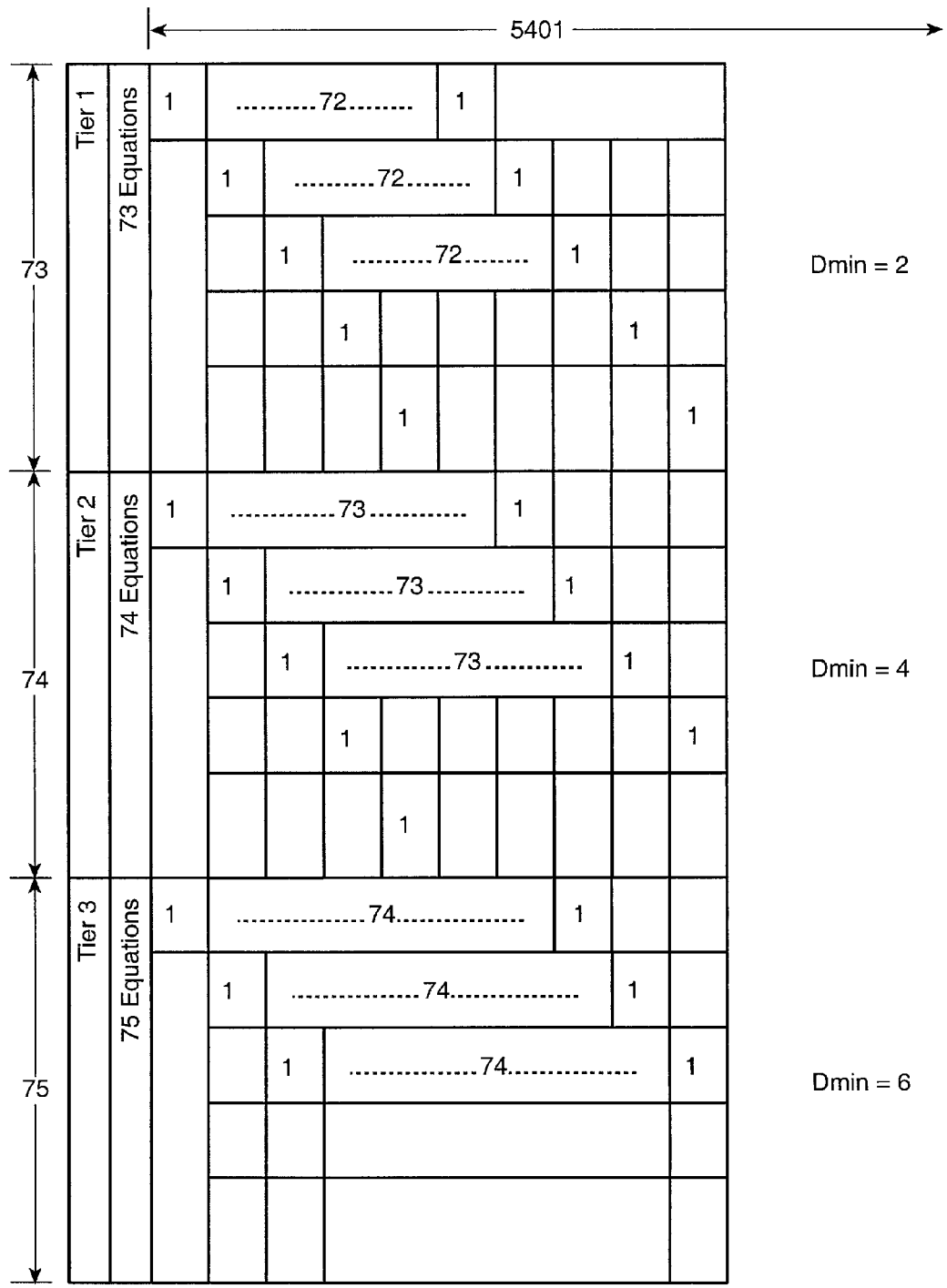
FIG._4

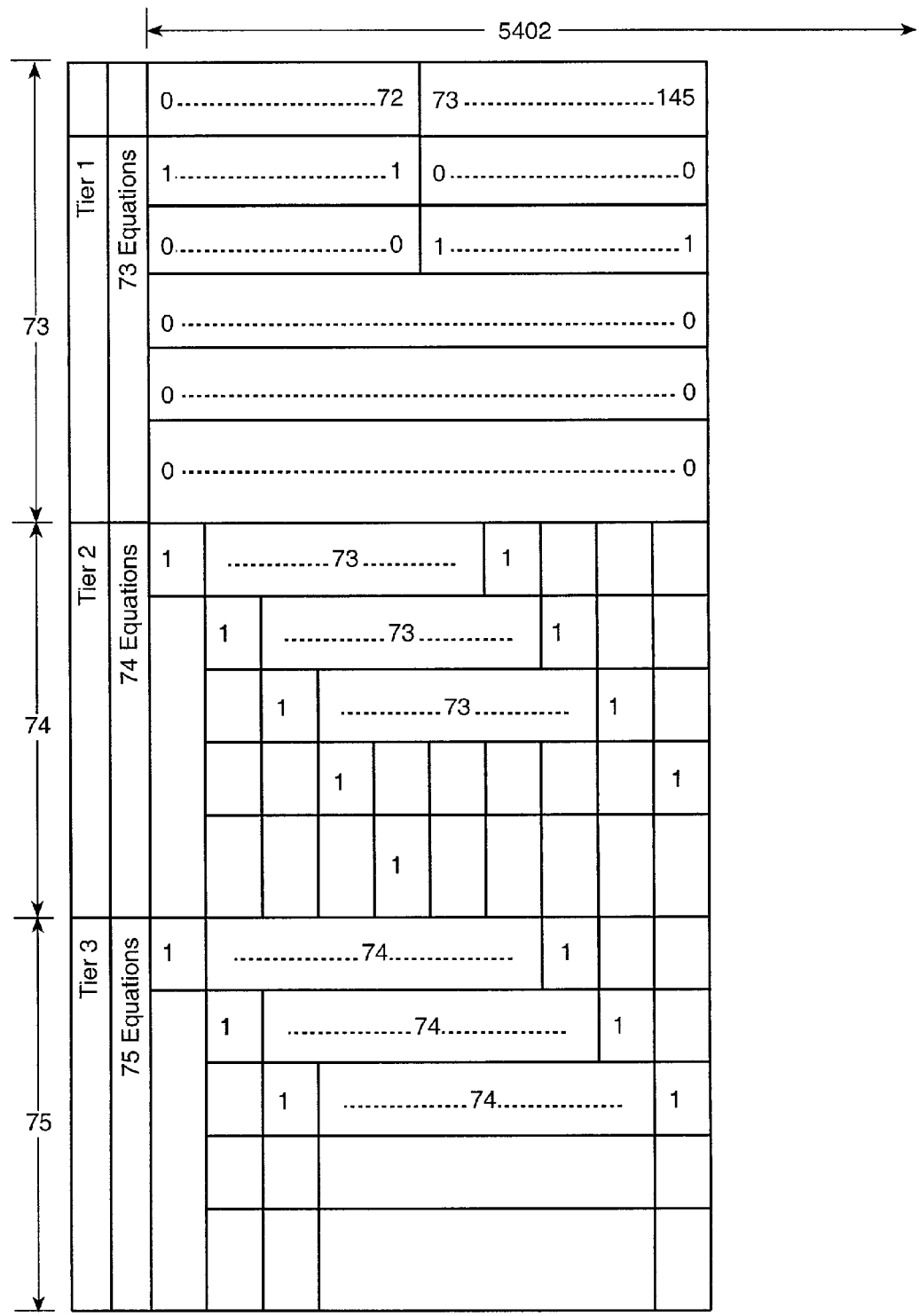
FIG._5

PARITY CHECK MATRIX AND METHOD OF FORMING THEREOF

CROSS REFERENCE TO RELATED APPLICATIONS

This application claims the benefit of Provisional Application No. 60/214,781, Jun. 28, 2000.

The present invention is related to the following commonly-assigned, copending applications:

"Multi-Mode Iterative Detector", filed on Apr. 27, 2000 and assigned application Ser. No. 09/559,186, the contents of which are incorporated herein by reference, "LDPC Encoder and Method Thereof", filed on even date and assigned application Ser. No. 09/730,752, the contents of which are incorporated herein by reference, "LDPC Decoder and Method Thereof", filed on even date and assigned application Ser. No. 09/730,603, the contents of which are incorporated herein by reference, and "Address Generator for LDPC Encoder and Decoder and Method Thereof" filed on even date and assigned application Ser. No. 09/730,597, the contents of which are incorporated herein by reference.

BACKGROUND OF THE INVENTION

1. Field of the Invention

The present invention relates generally to a parity check matrix for a linear block encoder and decoder in a data transmission system. More particularly, the present invention relates to a parity check matrix and method of forming thereof for a low-density parity-check code (LDPC) encoder for a write channel and decoder for a read channel in a disk drive system.

2. Description of the Related Art

FIGS. 1 and 2 illustrate data transmission systems each employing a linear block code encoder on the transmission side and a soft linear block code decoder on the receiver side. The linear block code utilized in various systems includes a low-density parity-check (LDPC) code.

With either system, the parity check matrix is an important element in a low-density parity-check (LDPC) code. The parity check matrix effects system performance in terms of computation efficiency, accuracy and reliability. A linear code is a set of codewords, x, satisfying the matrix equation (1)

$$H \cdot x = 0 \quad (1),$$

where H is an M×N matrix, and x is a 1×N vector.

The parity check matrix for an LDPC encoder/decoder is sparse, that is a small portion of the elements being one, all other elements being zero. An example of a parity check matrix is shown in equation 2 that corresponds to the factor graph shown in FIG. 3.

$$H = \begin{bmatrix} 1011 \\ 0111 \end{bmatrix} \quad (2)$$

which defines the following parity-check equations for the codeword x $$x1+x3+x4=0$$

$$x2+x3+x4=0$$

FIG. 3 is a factor graph of the parity matrix of equation 2. The factor graph contains two types of nodes the bit node (e.g. b1, b2, b3, and b4) and the check nodes (e.g. e1, e2). Each bit node corresponds to a bit in the codeword, and each check node represents a parity-check equation (i.e., a row in the parity check matrix H). Hence, the factor graph for an LDPC code with an M×N parity check matrix H contains M check nodes and N bit nodes. An edge between a check node and a bit node exists if and only if the bit participates in the parity-check equation represented by the check node. The factor graph shown in FIG. 3 is "bipartite" in which the nodes can be separated to two groups, namely check nodes and bit nodes. Connections are allowed only between nodes in different groups.

A cycle in a factor graph refers to a finite set of connected edges that start and end at the same node. The bold lines in FIG. 3 represent a cycle length of four. As can be appreciated by one of ordinary skill in the art, four is the shortest cycle length a parity check matrix can have. The inventors have observed that the existence of period-4 cycles causes degradation in performance of sum-product decoding algorithms. The sum-product algorithm is discussed by Zining Wu in *Coding and Iterative Detection For Magnetic Recording Channels*, 2000, Kluwer Academic Publishers, pages 55–60, the contents of which are incorporated by reference.

One example of a conventional parity-check is the simple parity-check (SPC) matrix. The simple parity check matrix is shown in Öberg, Mats and Siegel, Paul, *Parity Check codes For Partial Response Channels*, I.E.E.E. Global Telecommunications Conference—Globalcom '99, pages 717–722, 1999.

The SPC matrix is defined by two parameters, N and M, denoting the coded block length and the number of check equations, respectively. An example of an SPC matrix is shown in equation 4.

$$SPC(N, M) = \begin{bmatrix} 11 \ldots 100 \ldots 0 \\ 00 \ldots 011 \ldots 100 \ldots 0 \\ \ldots \\ \ldots \\ 0 \ldots 11 \ldots 1 \\ N \end{bmatrix} M \quad (4)$$

The factor graph corresponding to this parity check matrix does not contain any cycles. This matrix also has a column weight tc=1. Column weight tc refers to the number of "1"'s in each column. Since the complexity of the sum-product decoding algorithm increases linearly with tc, it is desirable to have a small tc. The minimum Hamming distance dmin=2 for the SPC matrix of equation (4). The Hamming distance is the minimum number of columns that are linearly dependent in the parity check matrix. A large dmin insures large separation between codewords, which results in a low bit error rate (BER). However the coding gain of the SPC matrix of equation (4) is limited since dmin=2. The code rate for the SPC matrix is 1−M/N.

Another conventional example of a parity check matrix is the interleaved parity check matrix in which additional parity-check equations are added to the SPC matrix in an interleaved way to increase the dmin. As shown in equation 5, an IPC matrix consists of two parts, the top part which is similar to an SPC matrix and the bottom part in which each row has the same number of "1"'s. The IPC matrix can be specified by one parameter P, which is the number of "1"'s in each row. This matrix has a dimension of 2P×P$^2$. The coded block length is P$^2$ and the number of parity-check equations are 2P.

$$IPC(3) = \begin{bmatrix} 111000000 \\ 000111000 \\ 000000111 \\ \ldots \\ 100100100 \\ 010010010 \\ 001001001 \end{bmatrix} \quad (5)$$

The IPC matrix does not contain any period-4 cycles, has a dmin=4 and tc=2. As is understood by one of ordinary skill in the art, there are only 2P−1 independent rows in the parity check matrix. The code rate for the IPC matrix is $(P^2-2P+1)$ $P^2$.

One construction of a D6 parity check matrix is shown in equation 6. Its basis is an IPC matrix having P as an even number. Its has a dimension of (3P−1)×P(P−1).

$$(4) = \begin{bmatrix} 111100000000 \\ 000011110000 \\ 000000001111 \\ 100010001000 \\ 010001000100 \\ 001000100010 \\ 000100010001 \\ \ldots \\ 100001000010 \\ 010000100001 \\ 001000010000 \\ 000100001000 \end{bmatrix} \begin{matrix} IPC \\ \\ \\ \\ \\ \text{Added Parity} \end{matrix} \quad (6)$$

The upper part contains 2P−1 rows and the bottom part contains P rows where the "1"'s are arranged diagonally with a shift of one column between each block. To obtain a Hamming distance of 6, then P−1, P and P+1 are relatively prime to each other. This matrix has a dmin=6, there is no cycle for period, tc=3−(1/(p+1)) or =3, and a code rate of $(P^2-4P+2)/(P^2-P)$.

SUMMARY OF THE INVENTION

According to a first aspect of the invention, a data transmission system is provided for transmitting user data to and receiving data from a communication channel, comprising a parity check matrix having M tiers, wherein M≧2, Dmin=2*M for M=1.3 or 2*M>Dmin≧6 for M>3, wherein Dmin is the minimum Hamming distance, tc=M, wherein tc is the column weight, and cycle−4=0. A linear block encoder encodes the user data in response to the parity check matrix, and a transmitter transmits an output of the linear block encoder to the communication channel. A soft channel decoder decodes data, and a soft linear block code decoder to decode data decoded by the soft channel decoder in response to the parity check matrix.

According to a second aspect of the present invention, a parity check matrix is provided for one of a low-density parity-check encoder and a low-density parity-check decoder. The comprises M tiers, wherein M≧2, Dmin=2*M for M=1.3 or 2*M≧Dmin≧6 for M>3, wherein Dmin is the minimum Hamming distance, tc=M, wherein tc is the column weight, and cycle−4=0.

According to a third aspect of the present invention, each of the M tiers comprises an identity matrix having a corresponding rank $P_i$, wherein 1≦i≦M.

According to a fourth aspect of the present invention, the rank of the identity matrix of one of the tiers is mutually prime with respect to the rank of the identity matrix of another one of the tiers.

According to a fifth aspect of the present invention, the M tiers are arranged in increasing rank order.

According to a sixth aspect of the present invention, the matrix comprises C columns, wherein $C \leq P_1 * P_2$.

According to a seventh aspect of the present invention, the matrix comprises R rows, wherein $$R = \sum_{i=1}^{M} P_i.$$

According to an eighth aspect of the present invention, the matrix comprises $$\sum_{i=1}^{M} P_i - (M-1)$$

independent rows.

According to a ninth aspect of the present invention, the matrix comprises $$\sum_{i=1}^{M} P_i - (M-1)$$

parity bits.

According to a tenth aspect of the present invention, the matrix comprises $$P_1 \times P_2 - \sum_{i=1}^{M} P_i + (M-1)$$

maximum user bits.

According to an eleventh third aspect of the present invention, for each element $$[A_{r,c}]$$

$$\text{For } \sum_{j=1}^{n-1} P_j + 1 \leq r \leq \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

$$0 \leq c \leq C$$

$$C \leq P_1 * P_2$$

According to a twelfth aspect of the present invention, M=3, the number of rows=$P_1+P_2+P_3$, the number of columns=P1*P2, dmin=6, and tc=3.

According to a thirteenth aspect of the present invention, a code rate=$(P_1*P_2+P_1-P_2-P_3+2)/(P_1*P_2)$.

According to a fourteenth aspect of the present invention, a data transmission system is provided for transmitting user data to and receiving data from a communication channel, comprising a parity check matrix having M tiers, M≧2, Dmin=2*M for M=1 . . . 3 or 2*M≧Dmin≧6 for M≧3, wherein Dmin is the minimum Hamming distance, tc=M, wherein tc is the column weight, and cycle-4=0. Linear block encoding means encodes the user data in response to the parity check matrix. Transmitting means transmits an output of the linear block encoding means to the communication channel, and soft channel decoding means decodes data. Soft linear block code decoding means decodes data decoded by the soft channel decoding means in response to the parity check matrix.

According to a fifteenth aspect of the present invention, a method is provided for transmitting data to and receiving data from a communication channel, comprising the steps of:
  (a) generating a parity check matrix comprising:
    M tiers, wherein M≧2,
    Dmin=2*M for M=1 . . . 3 or 2*M≧Dmin≧6 for M>3, wherein Dmin is the minimum Hamming distance, tc=M, wherein tc is the column weight, and cycle-4=0;
  (b) linear block encoding the data in accordance with the parity check matrix generated in step (a);
  (c) transmitting the data encoded in step (b) to the communication channel;
  (d) receiving the data from to the communication channel;
  (e) soft channel decoding the data read in step (d) in accordance with data decoded in step (g);
  (f) generating an address in accordance with the data soft linear block code decoding the data decoded in step (e); and
  soft linear block code decoding data decoded by in step (e) in accordance with the address generated in step(f).

According to a sixteenth aspect of the present invention, a computer program embodied in a medium is provided for transmitting data to and receiving data from a communication channel, comprising the steps of:
  (a) generating a parity check matrix comprising:
    M tiers, wherein M≧2,
    Dmin=2*M for M=1 . . . 3 or 2*M≧Dmin≧6 for M>3, wherein Dmin is the minimum Hamming distance, tc=M, wherein tc is the column weight, and cycle-4=0;
  (b) linear block encoding the data in accordance with the parity check matrix generated in step (a);
  (c) transmitting the data encoded in step (b) to the communication channel;
  (d) receiving the data from to the communication channel;
  (e) soft channel decoding the data read in step (d) in accordance with data decoded in step (g);
  (f) generating an address in accordance with the data soft linear block code decoding the data decoded in step (e); and
  soft linear block code decoding data decoded by in step (e) in accordance with the address generated in step(f).

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 4 is an example of a parity check matrix in accordance with the present invention;
and
FIG. 5 is another example of a parity check matrix in accordance with the present invention.

DESCRIPTION OF THE PREFERRED EMBODIMENTS

Figure 1:
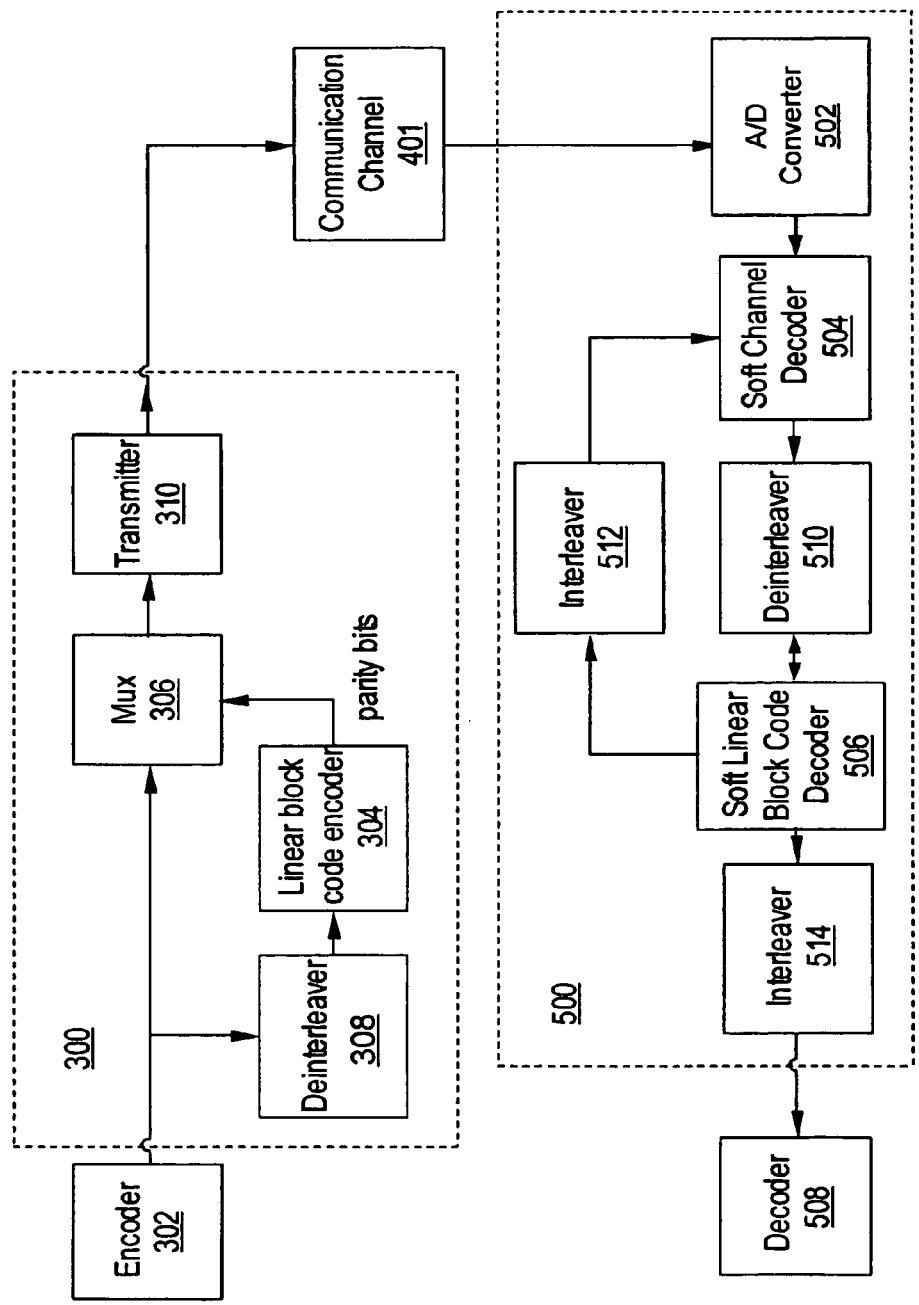
FIG. 1 is a block diagram of a data transmission system.
Figure 1A:
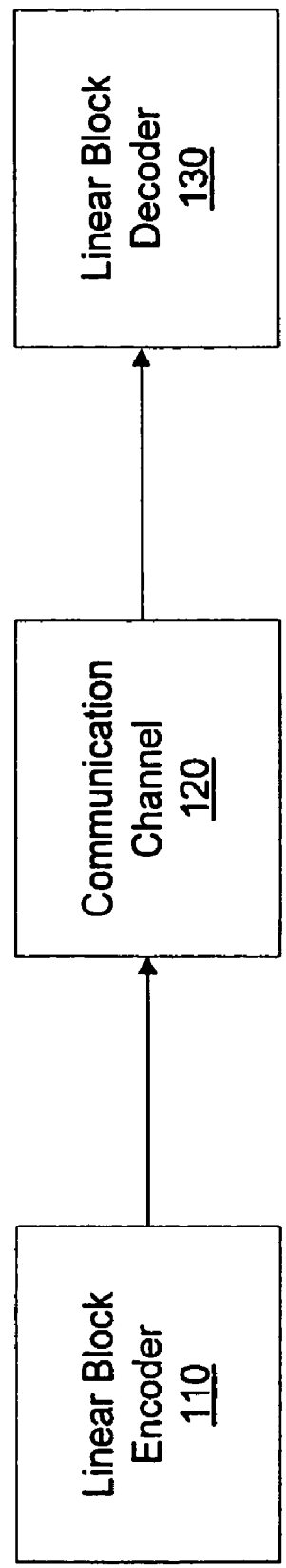
FIG. 1A is a block diagram of a generalized data transmission system

FIG. 1A is a block diagram of a generalized data transmission system. The generalized data transmission system comprises a linear block code encoder 110, a communication channel 120 and a linear block code decoder 130. The operation of the generalized data transmission system will now be discussed. Input data is encoded by linear block code encoder 110, which generates parity data in a known manner utilizing linear block codes. One example of a linear block code is a low-density parity-check (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the contents of each of which are incorporated in their entirety by reference. The data is then transmitted over communication channel 120. The data from communication channel 120 is then decoded by linear block code decoder 130 in a known manner.

Referring now to FIG. 1, which illustrates a more detailed conventional digital data transmission system. As shown therein, a digital data transmission system comprises a transmitting section 300 for transmitting user data to receiver 500 via communication channel 401.

The operation of transmission section 300 will now be explained. Prior to processing by transmitting section 300, input or user data maybe encoded with an error correcting code, such as the Reed/Solomon code, or run length limited code (RLL) or a combination thereof by encoder 302. The encoded output by encoder 302 is then deinterleaved by deinterleaver 308 for input to linear block code encoder 304 which generates parity data in a known manner utilizing linear block codes. Deinterleaver 308 permutes the data so that the same data is reordered before encoding by linear block code encoder 304. By permuting or redistributing the data, deinterleaver 308 attempts to reduce the number of nearest neighbors of small distance error events, when the channel contains intersymbol interference. User data at the output of encoder 302 is referred to as being in the channel domain; that is the order in which data is transmitted through the channel. The order of data processed by deinterleaver 308 is referred to as being in the linear block code domain. The parity data from linear block code encoder 304 is combined with the data encoded by encoder 302 by multiplexer 306 for input to channel transmitter 310.

Transmitter 310 transmits the combined user and parity data from multiplexer 306 typically as an analog signal over communication channel 401 in the channel domain. Communication channel 401 may include any wireless, wire, optical and the like communication medium. Receiver 500 comprises an analog to digital converter 502 to convert the data transmitted on communication channel 401 to a digital signal. The digital signal is input to soft channel decoder 504, which provides probability information of the detected data. Soft channel decoder 504 may be implemented by a soft Viterbi detector or the like. The output of the soft channel decoder 504, which is in the channel domain, is converted into the linear block code domain by deinterleaver 510. Deinterleaver 510 is constructed similarly to deinterleaver 308. Soft linear block code decoder 506 utilizes this information and the parity bits to decode the received data. One output of soft linear block code decoder 506 is fed back to soft channel decoder 504 via interleaver 512, which converts data in the linear block code domain to the channel domain. Interleaver 512 is constructed to perform the reverse operations of deinterleaver 510. Soft channel decoder 504 and soft linear block code decoder 506 operate in an iterative manner to decode the detected data.

The other output of soft linear block code decoder 506 is converted from the linear block domain to the channel domain by interleaver 514. Interleaver 514 is constructed similarly to interleaver 512. The output of interleaver 514 is passed on for further processing to decoder 508. Decoder 508 is implemented to perform the reverse operations of encoder 302 or correct for any errors in the received data.

Figure 2:
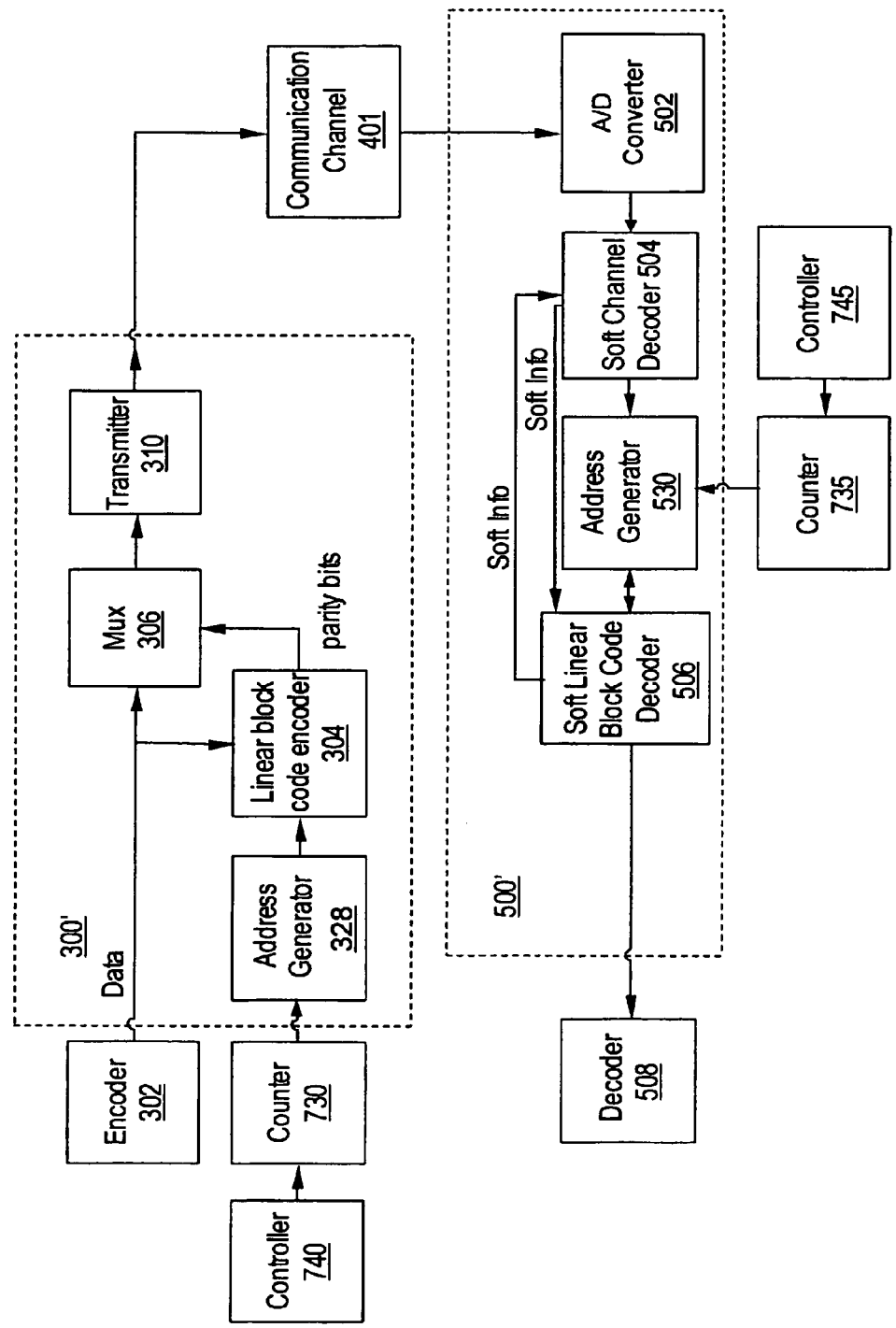
FIG. 2 is a block diagram of an alternate data transmission system.
Figure 3:
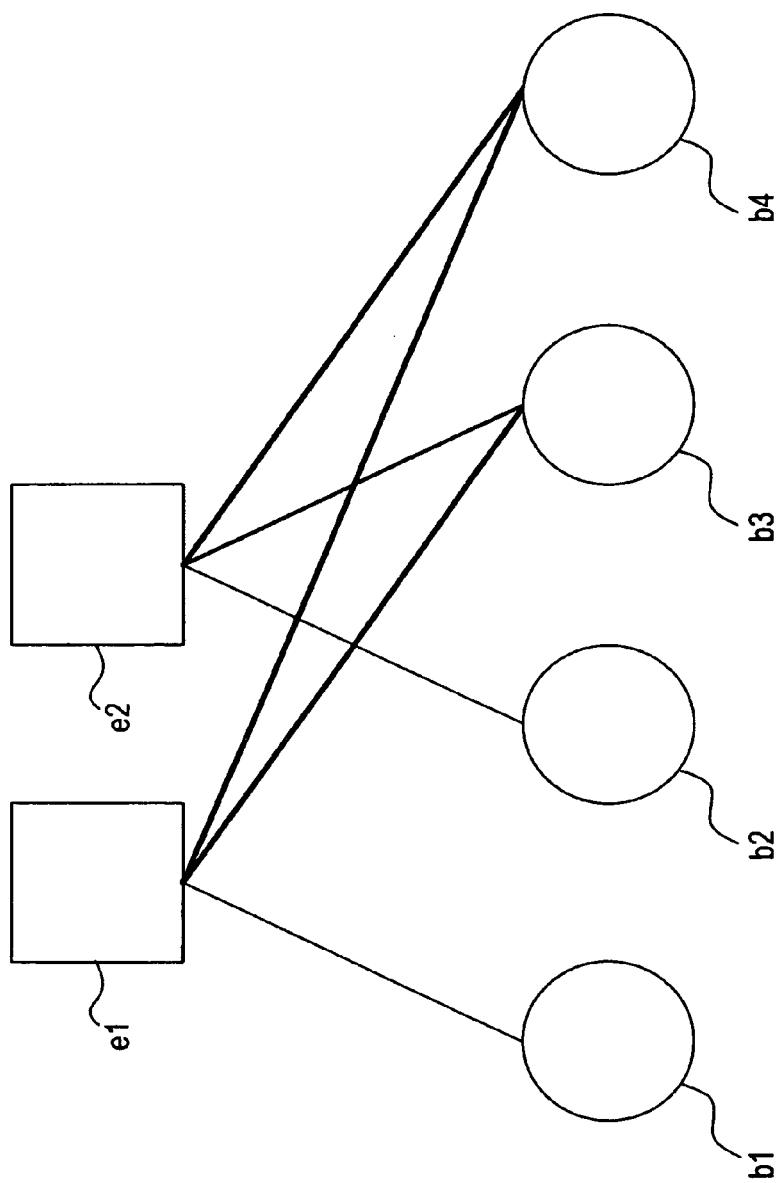
FIG. 3 is an example of a factor graph.

An alternative to incorporating deinterleaver 308 in transmission section 300 and deinterleaver 510 and interleavers 512 and 514 in receiving section 500 is to utilize an address generator to provide an address of the appropriate equation of the linear block code encoder. The address generator is described in "Address Generator for LDPC Encoder and Decoder and Method Thereof" filed on even date and assigned application Ser. No. 09/730,597, the contents of which are incorporated herein by reference. As discussed therein the linear block code encoder is not dependent on a position of a bit interleaved. Rather the linear block code encoder only requires a list of equations for a given bit. In other words, there is no need to process the data in the order defined by the deinterleaver, instead data may be processed in the same order as it is written to the channel. This can be accomplished by incorporating an address generator to provide an address of the appropriate equation of the linear block code encoder. This principle can be similarly applied to the soft linear block decoder. As a results and as illustrated in FIG. 2, deinterleaver 308 of the conventional system is now replaced by address generator 328, and deinterleaver 510 is now replaced by address generator 530. Accordingly, there is no requirement for the physical interleaving of data in the receiver 500' illustrated in FIG. 2, since the data remains in the same order as the order of bits of data in the channel throughout this system. The order of bits of data transmitted through the channel is referred to as the channel domain.

The linear block code encoder in FIGS. 1, 1A and 2 utilize a parity check matrix to generate the parity data. The parity check matrix in a low-density parity-check code, in accordance with the present invention, comprises no period-4 cycles. Period 4 cycles cause degradation in performance of the sum-product algorithm. Additionally, the parity check matrix comprises a large dmin or minimum Hamming distance of the code. This refers to the minimum number of columns that are linearly dependent in the parity check matrix. A large dmin insures separation between codewords to provide a low bit error rate. Another parameter tc is the number of "1"'s in each column of the parity check matrix.

Since the complexity of the sum-product decoding algorithm increases linearly with tc, the parity check matrix preferably has a small tc.

The parity check matrix in accordance with the present invention is shown in equation 7.

$$\begin{bmatrix} I_{P1,1} I_{P1,2} \cdots , I_{P1,r} \\ I_{P2,1} I_{P2,2} \cdots , I_{P2,r}* \\ I_{P3,1} I_{P3,2} \cdots , I_{P3,r}* \\ \cdots \\ I_{PM,1} I_{PM,2} \cdots , I_{PM,r}* \end{bmatrix} \quad (7)$$

In equation 7, $I_{Pi}$ denotes a $P_i \times P_i$ (rank $P_i$) identity matrix for i=1 to M.

Equation 8 shows an identity matrix with a rank of 4.

$$\begin{bmatrix} 1000 \\ 0100 \\ 0010 \\ 0001 \end{bmatrix} \quad (8)$$

The parity matrix can be generalized as comprising M tiers (M≦2), each tier i comprising a row of identity matrixes $I_{Pi}$ of rank $P_i$. The matrix is arranged such that $P_1 < \ldots < P_i < \ldots < P_M$ and $P_I, P_1, P_M$ are mutually prime. The number of columns in the preferred matrix is less than or equal to ($P_1 \times P_2$). As can be readily seen, for tiers greater than 2, the last matrix in each row is not complete. Equation 8A is illustrative of a partial identity matrix of rank 3.

$$\begin{bmatrix} 100 \\ 010 \\ 001 \\ 000 \end{bmatrix} \quad (8A)$$

More specifically, each element $A_{r,c}$, for row r and column c, is as follows:

$$\text{For } \sum_{j=1}^{n-1} P_j + 1 \leq r \leq \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

$$0 \leq c \leq C$$

$$C \leq P_1 * P_2$$

The parity matrix in accordance with the preferred embodiment of the present invention comprises a total of $$\sum_{i=1}^{M} P_i$$

rows in the matrix, of which $$\sum_{i=1}^{M} P_i - (M-1)$$

rows are independent. Thus the total number of parity bits is $$\sum_{i=1}^{M} P_i - (M-1),$$

and the maximum number of user bits is $$P_1 \times P_2 - \sum_{i=1}^{M} P_i + (M-1).$$

To accommodate a smaller sector size, the columns of the parity check matrix can be truncated. As such the number of user bits are reduced, while the number of parity bits and dmin remain the same. The preferred matrix in accordance with present invention comprises M tiers, Dmin=2M for M=1 ... 3 or $2*M \geq Dmin \geq 6$ for M>3, tc=M and cycle−4=0.

For M=3, the matrix has a dimension of $(P_1+P_2+P_3) \times (P_1*P_2)$, Dmin=6 and tc=3. The code rate for the matrix= $(P_1*P_2-P_1-P_2-P_3+2)/(P_1*P_2)$.

Reference is now made to FIG. 4, which shows a parity check matrix in accordance with the preferred embodiment of the present invention. The parity check matrix comprises 222 rows (or equations) by 5402 columns, which comprises 220 linearly independent rows (where 5402=73*74). The matrix can be divided into three tiers of equations having 73, 74 and 75 equations, respectively. As can be seen the tiers (73, 74 and 75) are mutually prime. The set of independent rows can be obtained by canceling the last row of the second tier and third tier, namely the $147^{th}$ row and the $222^{nd}$ row. The following table shows the values of the elements in the matrix:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75) |

Where r is the index within a tier.

A matrix having 5402 columns can process a maximum LDPC codeword of 5402 bits. Of course, as will be appreciated by one of ordinary skill in the art, the matrix may be truncated to accommodate a smaller block, however the matrix must be at least 222×4366. (The minimum size is dependent on the RLL encoding.) The preferred matrix contains no cycles, since a matrix having cycles has degraded performance that degrades exponentially. The Dmin can be determined as follows. With the first tier only, the parity check matrix has a $D_{min}=2$; by adding the second tier, the parity check matrix has a $D_{min}=4$; and by adding the third tier, the parity check matrix has a Dmin=6. This matrix does not to contain any period−4 cycles.

Reference is now made to FIG. 5, which shows an alternate parity check matrix in accordance with the preferred embodiment of the present invention. Similar to the previous parity check matrix, this parity check matrix comprises 222 rows (or equations) by 5402 columns, which comprises 220 linearly independent rows (where 5402=73*74). The matrix can be divided into three tiers of equations having 73, 74 and 75 equations, respectively. As can be seen the tiers (73, 74 and 75) are mutually prime. The set of independent rows can be obtained by canceling the last row of the second tier and third tier, namely the $147^{th}$ row and the $222^{nd}$ row. The following table shows the values of the elements in the matrix:

| Tier | $i^{th}$ position | $i^{th}$ position |
|---|---|---|
| 1 | 1 if r = floor (i/73) | 0 if r ≠ floor (i/73) |
| 2 | 1 if r = i(mod74) | 0 if r ≠ i(mod74) |
| 3 | 1 if r = i(mod75) | 0 if r ≠ i(mod75) |

Where r is the index within a tier.

While the invention has been described in conjunction with several specific embodiments, it is evident to those skilled in the art that many further alternatives, modifications and variations will be apparent in light of the foregoing description. More specifically, it is apparent that various matrix manipulations may be performed on the preferred matrix, which results in an equivalent. Such manipulated matrix falls with spirit and scope of the claims. While the present invention maybe implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A data transmission system for transmitting user data to and receiving data from a communication channel, comprising:

a parity check matrix comprising:

M tiers,
    wherein M ≥ 2,
Dmin = 2 * M for M = 1 ... 3 or
    $2*M \geq Dmin \geq 6$ for M > 3,
        wherein Dmin is the minimum Hamming distance,
tc = M,
    wherein tc is the column weight, and
cycle − 4 = 0;

a linear block encoder to encode the user data in response to said parity check matrix;

a transmitter to transmit an output of said linear block encoder to the communication channel;

a soft channel decoder to decode data; and a soft linear block code decoder to decode data decoded by said soft channel decoder in response to said parity check matrix.

2. A data transmission system according to claim 1, wherein each of said M tiers comprises an identity matrix having a corresponding rank $P_i$, wherein $1 \leq i \leq M$.

3. A data transmission system according to claim 2, wherein the rank of said identity matrix of one of said tiers is mutually prime with respect to the rank of said identity matrix of another one of said tiers.

4. A data transmission system according to claim 2, wherein said M tiers are arranged in increasing rank order.

5. A data transmission system according to claim 4, wherein said matrix comprises C columns, wherein $C \leq P_1 * P_2$.

6. A data transmission system according to claim 4, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

$$0 \leq c \leq C$$

$$C \leq P_1 * P_2$$

7. A data transmission system according to claim 4, wherein M=3, the number of rows=$P_1+P_2+P_3$, the number of columns=P1*P2, Dmin=6, and tc=3.

8. A data transmission system according to claim 7, wherein a code rate=$(P_1*P_2+P_1-P_2-P_3+2)/(P_1*P_2)$.

9. A data transmission system according to claim 2, wherein said matrix comprises R rows, wherein $$R = \sum_{i=1}^{M} P_i.$$

10. A data transmission system according to claim 9, wherein said matrix comprises $$\sum_{i=1}^{M} P_i - (M-1)$$

independent rows.

11. A data transmission system according to claim 2, wherein said matrix comprises $$\sum_{i=1}^{M} P_i - (M-1)$$

parity bits.

12. A data transmission system according to claim 2, wherein said matrix comprises $$P_1 \times P_2 - \sum_{i=1}^{M} P_i + (M-1)$$

maximum user bits.

13. A data transmission system according to claim 1, wherein said linear block code encoder comprises a low-density parity-check encoder and wherein said soft linear block code decoder comprises a low-density parity-check decoder.

14. A data transmission system according to claim 1, wherein said soft channel decoder comprises a soft Viterbi algorithm decoder.

15. A decoder for decoding data from a communication channel, comprising:
a parity check matrix comprising:

M tiers,
wherein M ≥ 2,
Dmin = 2 * M for M = 1 . . . 3 or
2*M ≥ Dmin ≥ 6 for M > 3,
wherein Dmin is the minimum Hamming distance,
tc = M,
wherein tc is the column weight, and
cycle − 4 = 0;

a soft channel decoder to decode data; and
a soft linear block code decoder to decode data decoded by said soft channel decoder in accordance with said parity check matrix.

16. A decoder according to claim 15, wherein each of said M tiers comprises an identity matrix having a corresponding rank $P_i$, wherein $1 \leq i \leq M$.

17. A decoder according to claim 16, wherein the rank of said identity matrix of one of said tiers is mutually prime with respect to the rank of said identity matrix of another one of said tiers.

18. A decoder according to claim 16, wherein said M tiers are arranged in increasing rank order.

19. A decoder according to claim 18, wherein said matrix comprises C columns, wherein $C \leq P_1 * P_2$.

20. A decoder according to claim 18, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

$$0 \leq c \leq C$$

$$C \leq P_1 * P_2$$

21. A decoder according to claim 18, wherein M=3, the number of rows=$P_1+P_2+P_3$, the number of columns=P1*P2, Dmin=6, and tc=3.

22. A decoder according to claim 21, wherein a code rate=$(P_1*P_2+P_1-P_2-P_3+2)/(P_1*P_2)$.

23. A decoder according to claim 16, wherein said matrix comprises R rows, wherein $$R = \sum_{i=1}^{M} P_i.$$

24. A decoder according to claim 23, wherein said matrix comprises $$\sum_{i=1}^{M} P_i - (M-1)$$

independent rows.

25. A decoder according to claim 16, wherein said matrix comprises $$\sum_{i=1}^{M} P_i - (M-1)$$

parity bits.

26. A decoder according to claim 16, wherein said matrix comprises $$P_1 \times P_2 - \sum_{i=1}^{M} P_i + (M-1)$$

maximum user bits.

27. A decoder according to claim 15, wherein said linear block code encoder comprises a low-density parity-check encoder and wherein said soft linear block code decoder comprises a low-density parity-check decoder.

28. A decoder according to claim 15, wherein said soft channel decoder comprises a soft Viterbi algorithm decoder.

29. An encoder for encoding data from a communication channel, comprising:
    a parity check matrix comprising:

M tiers,
        wherein M ≥ 2,
    Dmin = 2 * M for M = 1 . . . 3 or
        2*M ≥ Dmin ≥ 6 for M > 3,
            wherein Dmin is the minimum Hamming distance,
    tc = M,
        wherein tc is the column weight, and
    cycle − 4 = 0;

a linear block encoder to encode the user data in response said parity check matrix; and
    a transmitter to transmit an output of said linear block encoder to the communication channel.

30. An encoder according to claim 29, wherein each of said M tiers comprises an identity matrix having a corresponding rank $P_i$, wherein $1 \leq i \leq M$.

31. An encoder according to claim 30, wherein the rank of said identity matrix of one of said tiers is mutually prime with respect to the rank of said identity matrix of another one of said tiers.

32. An encoder according to claim 30, wherein said M tiers are arranged in increasing rank order.

33. An encoder according to claim 32, wherein said matrix comprises C columns, wherein $C \leq P_1 * P_2$.

34. An encoder according to claim 32, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c\bmod(P_n) = r - \sum_{j=1}^{n-1} P_j \\ 0, & \text{otherwise} \end{cases}$$

$$0 \leq c \leq C$$

$$C \leq P_1 * P_2$$

35. An encoder according to claim 32, wherein M=3, the number of rows=$P_1+P_2+P_3$, the number of columns=P1*P2, Dmin=6, and tc=3.

36. An encoder according to claim 35, wherein a code rate=$(P_1*P_2+P_1-P_2-P_3+2)/(P_1*P_2)$.

37. An encoder according to claim 30, wherein said matrix comprises R rows, wherein R=

$$R = \sum_{i=1}^{M} P_i.$$

$P_i$.

38. An encoder according to claim 37, wherein said matrix comprises $$\sum_{i=1}^{M} P_i - (M-1)$$

independent rows.

39. An encoder according to claim 30, wherein said matrix comprises $$\sum_{i=1}^{M} P_i - (M-1)$$

parity bits.

40. An encoder according to claim 30, wherein said matrix comprises $$P_1 \times P_2 - \sum_{i=1}^{M} P_i + (M-1)$$

maximum user bits.

41. An encoder according to claim 29, wherein said linear block code encoder comprises a low-density parity-check encoder and wherein said soft linear block code encoder comprises a low-density parity-check encoder.

42. An encoder according to claim 29, wherein said soft channel encoder comprises a soft Viterbi algorithm encoder.

43. A parity check matrix embodied in a medium for one of a low-density parity-check encoder and a low-density parity-check decoder, comprising M tiers,
    wherein $M \geq 2$,
    Dmin $= 2 * M$ for $M = 1 \ldots 3$ or
        $2*M \geq$ Dmin $\geq 6$ for $M > 3$,
            wherein Dmin is the minimum Hamming distance,
tc = M,
    wherein tc is the column weight, and
cycle $- 4 = 0$;

44. A parity check matrix according to claim 43, wherein each of said M tiers comprises an identity matrix having a corresponding rank $P_i$, wherein $1 \leq i \leq M$.

45. A parity check matrix according to claim 44, wherein the rank of said identity matrix of one of said tiers is mutually prime with respect to the rank of said identity matrix of another one of said tiers.

46. A parity check matrix according to claim 44 wherein said M tiers are arranged in increasing rank order.

47. A parity check matrix according to claim 46, wherein said matrix comprises C columns, wherein $C \leq P_1 * P_2$.

48. A parity check matrix according to claim 46, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c\text{mod}(P_n) = r - \sum_{j=1}^{n-1} P_j \\ 0, & \text{otherwise} \end{cases}$$

$$0 \leq c \leq C$$

$$C \leq P_1 * P_2$$

49. A parity check matrix according to claim 46, wherein M=3, the number of rows=$P_1+P_2+P_3$, the number of columns=P1*P2, Dmin=6, and tc=3.

50. A parity check matrix according to claim 49, wherein a code rate=$(P_1*P_2+P_1-P_2-P_3+2)/(P_1*P_2)$.

51. A parity check matrix according to claim 44, wherein said matrix comprises R rows, wherein $$R = \sum_{i=1}^{M} P_i.$$

52. A parity check matrix according to claim 51, wherein said matrix comprises $$\sum_{i=1}^{M} P_i - (M-1)$$

independent rows.

53. A parity check matrix according to claim 44, wherein said matrix comprises $$\sum_{i=1}^{M} P_i - (M-1)$$

parity bits.

54. A parity check matrix according to claim 44, wherein said matrix comprises $$P_1 \times P_2 - \sum_{i=1}^{M} P_i + (M-1)$$

maximum user bits.

55. A data transmission system for transmitting user data to and receiving data from a communication channel, comprising:

a parity check matrix comprising:

M tiers,
    wherein $M \geq 2$,
    Dmin $= 2 * M$ for $M = 1 \ldots 3$ or
        $2*M \geq$ Dmin $\geq 6$ for $M > 3$,
            wherein Dmin is the minimum Hamming distance,
tc = M,
    wherein tc is the column weight, and
cycle $- 4 = 0$;

linear block encoding means for encoding the user data in response to said parity check matrix;

transmitting means for transmitting an output of said linear block encoding means to the communication channel;

soft channel decoding means for decoding data; and soft linear block code decoding means for decoding data decoded by said soft channel decoding means in response to said parity check matrix.

56. A data transmission system according to claim 55, wherein each of said M tiers comprises an identity matrix having a corresponding rank $P_i$, wherein $1 \leq i \leq M$.

57. A data transmission system according to claim 56, wherein the rank of said identity matrix of one of said tiers is mutually prime with respect to the rank of said identity matrix of another one of said tiers.

58. A data transmission system according to claim 56, wherein said M tiers are arranged in increasing rank order.

59. A data transmission system according to claim 58, wherein said matrix comprises C columns, wherein $C \leq P_1 * P_2$.

60. A data transmission system according to claim 58, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c\text{mod}(P_n) = r - \sum_{j=1}^{n-1} P_j \\ 0, & \text{otherwise} \end{cases}$$

-continued $$0 \le c \le C$$
$$C \le P_1 * P_2$$

61. A data transmission system according to claim 58, wherein M=3, the number of rows=$P_1+P_2+P_3$, the number of columns=P1*P2, Dmin=6, and tc=3.

62. A data transmission system according to claim 61, wherein a code rate=$(P_1*P_2+P_1-P_2-P_3+2)/(P_1*P_2)$.

63. A data transmission system according to claim 56, wherein said matrix comprises R rows, wherein $$R = \sum_{i=1}^{M} P_i.$$

64. A data transmission system according to claim 63 wherein said matrix comprises $$\sum_{i=1}^{M} P_i - (M-1)$$

independent rows.

65. A data transmission system according to claim 56, wherein said matrix comprises $$\sum_{i=1}^{M} P_i - (M-1)$$

parity bits.

66. A data transmission system according to claim 56, wherein said matrix comprises $$P_1 \times P_2 - \sum_{i=1}^{M} P_i + (M-1)$$

maximum user bits.

67. A data transmission system according to claim 55 wherein said linear block code encoding means comprises a low-density parity-check encoding means and wherein said soft linear block code decoding means comprises a low-density parity-check decoding means.

68. A data transmission system according to claim 55, wherein said soft channel decoding means comprises a soft Viterbi algorithm decoding means.

69. A decoder for decoding data from a communication channel, comprising:
 a parity check matrix comprising:

M tiers,
   wherein M ≥ 2,
 Dmin = 2 * M for M = 1 . . . 3 or
   2*M ≥ Dmin ≥ 6 for M > 3, -continued wherein Dmin is the minimum Hamming distance,
 tc = M,
   wherein tc is the column weight, and
 cycle − 4 = 0;

soft channel decoding means for decoding data; and
 soft linear block code decoding means for decoding data decoded by said soft channel decoding means in accordance with said parity check matrix.

70. A decoder according to claim 69, wherein each of said M tiers comprises an identity matrix having a corresponding rank $P_i$, wherein $1 \le i \le M$.

71. A decoder according to claim 70, wherein the rank of said identity matrix of one of said tiers is mutually prime with respect to the rank of said identity matrix of another one of said tiers.

72. A decoder according to claim 70, wherein said M tiers are arranged in increasing rank order.

73. A decoder according to claim 72, wherein said matrix comprises C columns, wherein $C \le P_1*P_2$.

74. A decoder according to claim 72, wherein for each element $A_{r,c}$ $$\text{For } \sum_{j=1}^{n-1} P_j + 1 \le r \le \sum_{j=1}^{n} P_j,$$

$$A_{r,c} = \begin{cases} 1, & \textit{if } c\,\text{mod}(P_n) = r - \sum_{j=1}^{n-1} P_j \\ 0, & \text{otherwise} \end{cases}$$

$$0 \le c \le C$$
$$C \le P_1 * P_2$$

.

75. A decoder according to claim 72, wherein M=3, the number of rows=$P_1+P_2+P_3$, the number of columns=P1*P2, Dmin=6, and tc=3.

76. A decoder according to claim 75, wherein a code rate=$(P_1*P_2+P_1-P_2-P_3+2)/(P_1*P_2)$.

77. A decoder according to claim 70, wherein said matrix comprises R rows, wherein $$R = \sum_{i=1}^{M} P_i.$$

78. A decoder according to claim 77, wherein said matrix comprises $$\sum_{i=1}^{M} P_i - (M-1)$$

independent rows.

79. A decoder according to claim 70, wherein said matrix comprises $$\sum_{i=1}^{M} P_i - (M-1)$$

parity bits.

80. A decoder according to claim 70, wherein said matrix comprises $$P_1 \times P_2 - \sum_{i=1}^{M} P_i + (M-1)$$

maximum user bits.

81. A decoder according to claim 69, wherein said linear block code encoding means comprises a low-density parity-check encoding means and wherein said soft linear block code decoding means comprises a low-density parity-check decoding means.

82. A decoder according to claim 69, wherein said soft channel decoding means comprises a soft Viterbi algorithm decoding means.

83. An encoder for encoding data from a communication channel, comprising:
 a parity check matrix comprising:

---

M tiers,
 wherein M ≧ 2,
 Dmin = 2 * M for M = 1 . . . 3 or
  2*M ≧ Dmin ≧ 6 for M > 3,
  wherein Dmin is the minimum Hamming distance,
 tc = M,
  wherein tc is the column weight, and
 cycle − 4 = 0;

--- linear block encoding means for encoding the user data in response said parity check matrix; and
transmitting means for transmitting an output of said linear block encoding means to the communication channel.

84. An encoder according to claim 83, wherein each of said M tiers comprises an identity matrix having a corresponding rank $P_i$, wherein $1 \leq i \leq M$.

85. An encoder according to claim 84, wherein the rank of said identity matrix of one of said tiers is mutually prime with respect to the rank of said identity matrix of another one of said tiers.

86. An encoder according to claim 84, wherein said M tiers are arranged in increasing rank order.

87. An encoder according to claim 86, wherein said matrix comprises C columns, wherein $C \leq P_1 * P_2$.

88. An encoder according to claim 86, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

-continued $0 \leq c \leq C$ $C \leq P_1 * P_2.$

89. An encoder according to claim 86, wherein M=3, the number of rows=$P_1+P_2+P_3$, the number of columns=P1*P2, Dmin=6, and tc=3.

90. An encoder according to claim 89, wherein a code rate=$(P_1*P_2+P_1-P_2-P_3+2)/(P_1*P_2)$.

91. An encoder according to claim 84, wherein said matrix comprises R rows, wherein $$R = \sum_{i=1}^{M} P_i.$$

92. An encoder according to claim 91, wherein said matrix comprises $$\sum_{i=1}^{M} P_i - (M-1)$$

independent rows.

93. An encoder according to claim 84, wherein said matrix comprises $$\sum_{i=1}^{M} P_i - (M-1)$$

parity bits.

94. An encoder according to claim 84, wherein said matrix comprises $$P_1 \times P_2 - \sum_{i=1}^{M} P_i + (M-1)$$

maximum user bits.

95. An encoder according to claim 83, wherein said linear block code encoding means comprises a low-density parity-check encoding means and wherein said soft linear block code encoding means comprises a low-density parity-check encoding means.

96. An encoder according to claim 83, wherein said soft channel encoding means comprises a soft Viterbi algorithm encoding means.

97. A method for transmitting data to and receiving data from a communication channel, comprising the steps of:
 (a) generating a parity check matrix comprising:

---

M tiers,
 wherein M ≧ 2,
 Dmin = 2 * M for M = 1 . . . 3 or
  2*M ≧ Dmin ≧ 6 for M > 3, -continued > wherein Dmin is the minimum Hamming distance,
> tc = M,
> wherein tc is the column weight, and
> cycle − 4 = 0;

(b) linear block encoding the data in accordance with the parity check matrix generated in step (a);

(c) transmitting the data encoded in step (b) to the communication channel;

(d) receiving the data from the communication channel;

(e) soft channel decoding the data read in step (d) in accordance with data decoded in step (g);

(f) generating an address in accordance with the data soft linear block code decoding the data decoded in step (e); and (g) soft linear block code decoding data decoded by in step (e) in accordance with the address generated in step(f).

98. A method according to claim 97, wherein each of said M tiers comprises an identity matrix having a corresponding rank $P_i$, wherein $1 \leq i \leq M$.

99. A method according to claim 98, wherein the rank of said identity matrix of one of said tiers is mutually prime with respect to the rank of said identity matrix of another one of said tiers.

100. A method according to claim 98, wherein said M tiers are arranged in increasing rank order.

101. A method according to claim 100, wherein said matrix comprises C columns, wherein $C \leq P_1 * P_2$.

102. A method according to claim 100, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \textit{if } c\text{mod}(P_n) = r - \sum_{j=1}^{n-1} P_j \\ 0, & \text{otherwise} \end{cases}$$

$$0 \leq c \leq C$$

$$C \leq P_1 * P_2.$$

103. A method according to claim 100, wherein M=3, the number of rows=$P_1+P_2+P_3$, the number of columns=P1*P2, Dmin=6, and tc=3.

104. A method according to claim 103, wherein a code rate=$(P_1*P_2+P_1-P_2-P_3+2)/(P_1*P_2)$.

105. A method according to claim 98, wherein said matrix comprises R rows, wherein $$R = \sum_{i=1}^{M} P_i.$$

106. A method according to claim 105, wherein said matrix comprises $$\sum_{i=1}^{M} P_i - (M-1)$$

independent rows.

107. A method according to claim 98, wherein said matrix comprises $$\sum_{i=1}^{M} P_i(M-1)$$

parity bits.

108. A method according to claim 98, wherein said matrix comprises $$P_1 \times P_2 - \sum_{i=1}^{M} P_i + (M-1)$$

maximum user bits.

109. A method for decoding data received from a communication channel, comprising the steps of:

(a) soft channel decoding the data received from the communication channel in accordance with data decoded in step (c);

(b) generating a parity check matrix comprising:

> M tiers,
> wherein M ≥ 2,
> Dmin = 2 * M for M = 1 . . . 3 or
> 2*M ≥ Dmin ≥ 6 for M > 3,
> wherein Dmin is the minimum Hamming distance,
> tc = M,
> wherein tc is the column weight, and
> cycle − 4 = 0;

(c) soft linear block code decoding data decoded in step (a) in accordance with the matrix generated in step(b).

110. A method according to claim 109, wherein each of said M tiers comprises an identity matrix having a corresponding rank $P_i$, wherein $1 \leq i \leq M$.

111. A method according to claim 110, wherein the rank of said identity matrix of one of said tiers is mutually prime with respect to the rank of said identity matrix of another one of said tiers.

112. A method according to claim 110, wherein said M tiers are arranged in increasing rank order.

113. A method according to claim 112, wherein said matrix comprises C columns, wherein $C \leq P_1 * P_2$.

114. A method according to claim 112, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \textit{if } c\text{mod}(P_n) = r - \sum_{j=1}^{n-1} P_j \\ 0, & \text{otherwise} \end{cases}$$

-continued $$0 \le c \le C$$

$$C \le P_1 * P_2.$$

115. A method according to claim 112, wherein M=3, the number of rows=$P_1+P_2+P_3$, the number of columns=P 1*P2, Dmin=6, and tc=3.

116. A method according to claim 115, wherein a code rate=$(P_1*P_2+P_1-P_2-P_3+2)/(P_1*P_2)$.

117. A method according to claim 110, wherein said matrix comprises R rows, wherein $$R = \sum_{i=1}^{M} P_i.$$

118. A method according to claim 117, wherein said matrix comprises $$\sum_{i=1}^{M} P_i - (M-1)$$

independent rows.

119. A method according to claim 110, wherein said matrix comprises $$\sum_{i=1}^{M} P_i - (M-1)$$

parity bits.

120. A method according to claim 110, wherein said matrix comprises $$P_1 \times P_2 - \sum_{i=1}^{M} P_i + (M-1)$$

maximum user bits.

121. A method for encoding data transmitted to a communication channel, comprising the steps of:
(a) generating a parity check matrix comprising:

---

M tiers,
  wherein M ≥ 2,
Dmin = 2 * M for M = 1 . . . 3 or
  2*M ≥ Dmin ≥ 6 for M > 3,
    wherein Dmin is the minimum Hamming distance,
tc = M,
  wherein tc is the column weight, and
cycle − 4 = 0;[[;]]

---

(b) linear block encoding the data in accordance with the matrix generated in step (a); and
(c) transmitting the data encoded in step (b) to the communication channel.

122. A method according to claim 121, wherein each of said M tiers comprises an identity matrix having a corresponding rank $P_i$, wherein 1≤i≤M.

123. A method according to claim 122, wherein the rank of said identity matrix of one of said tiers is mutually prime with respect to the rank of said identity matrix of another one of said tiers.

124. A method according to claim 122, wherein said M tiers are arranged in increasing rank order.

125. A method according to claim 124, wherein said matrix comprises C columns, wherein $C \le P_1*P_2$.

126. A method according to claim 124, wherein for each element $A_{r,c}$ $$\text{For } \sum_{j=1}^{n-1} P_j + 1 \le r \le \sum_{j=1}^{n} P_j,$$

$$A_{r,c} = \begin{cases} 1, & \text{if } c \bmod(P_n) = r - \sum_{j=1}^{n-1} P_j \\ 0, & \text{otherwise} \end{cases}$$

$$0 \le c \le C$$

$$C \le P_1 * P_2.$$

127. A method according to claim 124, wherein M=3, the number of rows=$P_1+P_2+P_3$, the number of columns=P1*P2, Dmin=6, and tc=3.

128. A method according to claim 127, wherein a code rate=$(P_1*P_2+P_1-P_2-P_3+2)/(P_1*P_2)$.

129. A method according to claim 122, wherein said matrix comprises R rows, wherein $$R = \sum_{i=1}^{M} P_i.$$

130. A method according to claim 129, wherein said matrix comprises $$\sum_{i=1}^{M} P_i - (M-1)$$

independent rows.

131. A method according to claim 122, wherein said matrix comprises $$\sum_{i=1}^{M} P_i - (M-1)$$

parity bits.

132. A method according to claim 122, wherein said matrix comprises $$P_1 \times P_2 - \sum_{i=1}^{M} P_i + (M-1)$$

maximum user bits.

133. A computer program embodied in a medium for transmitting data to and receiving data from a communication channel, comprising the steps of:
   (a) generating a parity check matrix comprising:

---
M tiers,
   wherein M ≧ 2,
Dmin = 2 * M for M = 1 ... 3 or
   2*M ≧ Dmin ≧ 6 for M > 3,
      wherein Dmin is the minimum Hamming distance,
tc = M,
   wherein tc is the column weight, and
cycle − 4 = 0;
---

(b) linear block encoding the data in accordance with the parity check matrix generated in step (a);
   (c) transmitting the data encoded in step (b) to the communication channel;
   (d) receiving the data from the communication channel;
   (e) soft channel decoding the data read in step (d) in accordance with data decoded in step (g);
   (f) generating an address in accordance with the data soft linear block code decoding the data decoded in step (e); and
   (g) soft linear block code decoding data decoded by in step (e) in accordance with the address generated in step(f).

134. A computer program according to claim 133, wherein each of said M tiers comprises an identity matrix having a corresponding rank $P_i$, wherein $1 \leq i \leq M$.

135. A computer program according to claim 134, wherein the rank of said identity matrix of one of said tiers is mutually prime with respect to the rank of said identity matrix of another one of said tiers.

136. A computer program according to claim 134, wherein said M tiers are arranged in increasing rank order.

137. A computer program according to claim 136, wherein said matrix comprises C columns, wherein $C \leq P_1 * P_2$.

138. A computer program according to claim 136, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c\bmod(P_n) = r - \sum_{j=1}^{n-1} P_j \\ 0, & \text{otherwise} \end{cases}$$

$$0 \leq c \leq C$$

$$C \leq P_1 * P_2.$$

139. A computer program according to claim 136, wherein M=3, the number of rows=$P_1+P_2+P_3$, the number of columns=P1*P2, Dmin=6, and tc=3.

140. A computer program according to claim 139, wherein a code rate=$(P_1*P_2+P_1-P_2-P_3+2)/(P_1*P_2)$.

141. A computer program according to claim 134, wherein said matrix comprises R rows, wherein $$R = \sum_{i=1}^{M} P_i.$$

142. A computer program according to claim 141, wherein said matrix comprises $$\sum_{i=1}^{M} P_i - (M-1)$$

independent rows.

143. A computer program according to claim 134, wherein said matrix comprises $$\sum_{i=1}^{M} P_i - (M-1)$$

parity bits.

144. A computer program according to claim 134, wherein said matrix comprises $$P_1 \times P_2 - \sum_{i=1}^{M} P_i + (M-1)$$

maximum user bits.

145. A computer program embodied in a medium for decoding data received from a communication channel, comprising the steps of:
   (a) soft channel decoding the data received from the communication channel in accordance with data decoded in step (c);
   (b) generating a parity check matrix comprising:

---
M tiers,
   wherein M ≧ 2,
Dmin = 2 * M for M = 1 ... 3 or
   2*M ≧ Dmin ≧ 6 for M > 3,
      wherein Dmin is the minimum Hamming distance,
tc = M,
   wherein tc is the column weight, and
cycle − 4 = 0; and
---

(c) soft linear block code decoding data decoded in step (a) in accordance with the matrix generated in step(b).

146. A computer program according to claim 145, wherein each of said M tiers comprises an identity matrix having a corresponding rank $P_i$, wherein $1 \leq i \leq M$.

147. A computer program according to claim 146, wherein the rank of said identity matrix of one of said tiers is mutually prime with respect to the rank of said identity matrix of another one of said tiers.

148. A computer program according to claim 146, wherein said M tiers are arranged in increasing rank order.

149. A computer program according to claim 148, wherein said matrix comprises C columns, wherein $C \leq P_1 * P_2$.

150. A computer program according to claim 148, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \textit{if } c \bmod(P_n) = r - \sum_{j=1}^{n-1} P_j \\ 0, & \text{otherwise} \end{cases}$$

$$0 \leq c \leq C$$

$$C \leq P_1 * P_2.$$

151. A computer program according to claim 148, wherein M=3, the number of rows=$P_1+P_2+P_3$, the number of columns=P1*P2, Dmin=6, and tc=3.

152. A computer program according to claim 151, wherein a code rate=$(P_1*P_2+P_1-P_2-P_3+2)/(P_1*P_2)$.

153. A computer program according to claim 146, wherein said matrix comprises R rows, wherein $$R = \sum_{i=1}^{M} P_i.$$

154. A computer program according to claim 153, wherein said matrix comprises $$\sum_{i=1}^{M} P_i - (M-1)$$

independent rows.

155. A computer program according to claim 146, wherein said matrix comprises $$\sum_{i=1}^{M} P_i - (M-1)$$

parity bits.

156. A computer program according to claim 146, wherein said matrix comprises $$P_1 \times P_2 - \sum_{i=1}^{M} P_i + (M-1)$$

maximum user bits.

157. A computer program embodied in a medium for encoding data transmitted to a communication channel, comprising the steps of:

(a) generating a parity check matrix comprising:

M tiers,
 wherein M ≥ 2,
 Dmin = 2 * M for M = 1 . . . 3 or

-continued

2*M ≥ Dmin ≥ 6 for M > 3,
  wherein Dmin is the minimum Hamming distance,
 tc = M,
  wherein tc is the column weight, and
 cycle − 4 = 0;

(b) linear block encoding the data in accordance with the matrix generated in step (a); and (c) transmitting the data encoded in step (b) to the communication channel.

158. A computer program according to claim 157, wherein each of said M tiers comprises an identity matrix having a corresponding rank $P_i$, wherein 1≤i≤M.

159. A computer program according to claim 158, wherein the rank of said identity matrix of one of said tiers is mutually prime with respect to the rank of said identity matrix of another one of said tiers.

160. A computer program according to claim 158, wherein said M tiers are arranged in increasing rank order.

161. A computer program according to claim 160, wherein said matrix comprises C columns, wherein C≤$P_1*P_2$.

162. A computer program according to claim 160, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \textit{if } c \bmod(P_n) = r - \sum_{j=1}^{n-1} P_j \\ 0, & \text{otherwise} \end{cases}$$

$$0 \leq c \leq C$$

$$C \leq P_1 * P_2.$$

163. A computer program according to claim 160, wherein M=3, the number of rows=$P_1+P_2+P_3$, the number of columns=P1*P2, Dmin=6, and tc=3.

164. A computer program according to claim 163, wherein a code rate=$(P_1*P_2+P_1-P_2-P_3+2)/(P_1*P_2)$.

165. A computer program according to claim 158, wherein said matrix comprises R rows, wherein $$R = \sum_{i=1}^{M} P_i.$$

166. A computer program according to claim 165, wherein said matrix comprises $$\sum_{i=1}^{M} P_i - (M-1)$$

independent rows.

167. A computer program according to claim 158, wherein said matrix comprises $$\sum_{i=1}^{M} P_i - (M-1)$$

parity bits.

168. A computer program according to claim 158, wherein said matrix comprises $$P_1 \times P_2 - \sum_{i=1}^{M} P_i + (M-1)$$

maximum user bits.

169. A method for generating a parity check matrix for one of a low-density parity-check encoder and a low-density parity-check decoder, comprising the steps of:

providing M tiers of element,
  wherein M ≧ 2
selecting Dmin = 2 * M for M = 1 . . . 3 or
  2*M ≧ Dmin ≧ 6 for M > 3,
    wherein Dmin is the minimum Hamming distance,
selecting tc = M,
  wherein tc is the column weight, and
selecting cycle − 4 = 0.

170. A method according to claim 169, wherein each of said M tiers comprises an identity matrix having a corresponding rank $P_i$, wherein $1 \leq i \leq M$.

171. A method according to claim 170, further comprising the step of setting the rank of said identity matrix of one of said tiers to be mutually prime with respect to the rank of said identity matrix of another one of said tiers.

172. A method according to claim 170, further comprising the step of arranging said M tiers in increasing rank order.

173. A method according to claim 172, wherein for each element $A_{r,c}$ $$\text{For } \sum_{j=1}^{n-1} P_j + 1 \leq r \leq \sum_{j=1}^{n} P_j,$$

$$A_{r,c} = \begin{cases} 1, & \text{if } c\bmod(P_n) = r - \sum_{j=1}^{n-1} P_j \\ 0, & \text{otherwise} \end{cases}$$

$$0 \leq c \leq C$$

$$C \leq P_1 * P_2.$$

174. A method according to claim 172, wherein M=3, the number of rows=$P_1+P_2+P_3$, the number of columns=P1*P2, Dmin=6, and tc=3.

175. A method according to claim 174, wherein a code rate=$(P_1*P_2+P_1-P_2-P_3+2)/(P_1*P_2)$.

176. A method according to claim 172, wherein said matrix comprises C columns, wherein $C \leq P_1*P_2$.

177. A method according to claim 170, wherein said matrix comprises R rows, wherein $$R = \sum_{i=1}^{M} P_i.$$

178. A method according to claim 177, wherein said matrix comprises $$\sum_{i=1}^{M} P_i - (M-1)$$

independent rows.

179. A method according to claim 170, wherein said matrix comprises $$\sum_{i=1}^{M} P_i - (M-1)$$

parity bits.

180. A method according to claim 170, wherein said matrix comprises $$P_1 \times P_2 - \sum_{i=1}^{M} P_i + (M-1)$$

maximum user bits.

181. A computer program embodied in a medium for generating a parity check matrix for one of a low-density parity-check encoder and a low-density parity-check decoder, comprising the steps of:

providing M tiers of element,
  wherein M ≧ 2
selecting Dmin = 2 * M for M = 1 . . . 3 or
  2*M ≧ Dmin ≧ 6 for M > 3,
    wherein Dmin is the minimum Hamming distance,
selecting tc = M,
  wherein tc is the column weight, and
selecting cycle − 4 = 0.

182. A computer program according to claim 181, wherein each of said M tiers comprises an identity matrix having a corresponding rank $P_i$, wherein $1 \leq i \leq M$.

183. A computer program according to claim 182, further comprising the step of setting the rank of said identity matrix of one of said tiers to be mutually prime with respect to the rank of said identity matrix of another one of said tiers.

184. A computer program according to claim 182, further comprising the step of arranging said M tiers in increasing rank order.

185. A computer program according to claim 184, wherein said matrix comprises C columns, wherein $C \leq P_1*P_2$.

186. A computer program according to claim 184, wherein for each element $A_{r,c}$ For $\sum_{j=1}^{n-1} P_j + 1 \le r \le \sum_{j=1}^{n} P_j$, $$A_{r,c} = \begin{cases} 1, & \text{if } c\bmod(P_n) = r - \sum_{j=1}^{n-1} P_j \\ 0, & \text{otherwise} \end{cases}$$

$0 \le c \le C$ $C \le P_1 * P_2$.

187. A computer program according to claim 184, wherein M=3, the number of rows=$P_1+P_2+P_3$, the number of columns=P1*P2, Dmin=6, and tc=3.

188. A computer program according to claim 187, wherein a code rate=$(P_1*P_2+P_1-P_2-P_3+2)/(P_1*P_2)$.

189. A computer program according to claim 182, wherein said matrix comprises R rows, wherein $$R = \sum_{i=1}^{M} P_i.$$

190. A computer program according to claim 189, wherein said matrix comprises $$\sum_{i=1}^{M} P_i - (M-1)$$

independent rows.

191. A computer program according to claim 182, wherein said matrix comprises $$\sum_{i=1}^{M} P_i - (M-1)$$

parity bits.

192. A computer program according to claim 182, wherein said matrix comprises $$P_1 \times P_2 - \sum_{i=1}^{M} P_i + (M-1)$$

maximum user bits.

* * * * *

UNITED STATES PATENT AND TRADEMARK OFFICE
CERTIFICATE OF CORRECTION

PATENT NO. : 7,000,177 B1
APPLICATION NO. : 09/730598
DATED : February 14, 2006
INVENTOR(S) : Zining Wu et al.

It is certified that error appears in the above-identified patent and that said Letters Patent is hereby corrected as shown below:

| | |
|---|---|
| Column 3, Line 15 | Insert --/-- between "$(P^2-2P+1)$" and "$P^2$" |
| Column 3, Line 43 | Delete "=3" and insert -- $\approx$ -- after "or" |
| Column 3, Line 52 | Delete ">" and insert --$\geq$-- |
| Column 3, Line 64 | After "wherein" delete "$M \leq 2$" and insert --$M \geq 2$-- |
| Column 5, Line 10 | After second occurrence of "for" delete "$M \geq 3$" and insert --$M>3$-- |
| Column 6, Line 11 | Insert --;-- after "system" |
| Column 7, Line 46 | Delete "results" and insert --result,-- |
| Column 8, Line 8 | Equation 7 -- Delete "," after "..." and insert --i-- |
| Column 9, Line 66 | Delete "Dmin" and insert --$D_{min}$-- |
| Column 9, Line 67 | Delete "to" after "not" |
| Column 10, Line 36 | Delete "obtain" and insert --obtained-- |
| Column 13, Line 55 | Insert --to-- after "response" |
| Column 14, Line 33 | Delete second "P;" at end of equation |
| Column 19, Line 40 | Insert --to-- after "response" |
| Column 23, Line 62 | Delete "[[:]]" at end of line |

Signed and Sealed this

Second Day of January, 2007

JON W. DUDAS
*Director of the United States Patent and Trademark Office*